(12) United States Patent
Ong

(10) Patent No.: US 9,111,625 B2
(45) Date of Patent: Aug. 18, 2015

(54) ADAPTIVE DUAL VOLTAGE WRITE DRIVER WITH DUMMY RESISTIVE PATH TRACKING

(71) Applicant: Samsung Electronics Co., Ltd., Suwon-si, Gyeonggi-do (KR)

(72) Inventor: Adrian E. Ong, Pleasanton, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/091,319

(22) Filed: Nov. 26, 2013

(65) Prior Publication Data

US 2015/0043271 A1     Feb. 12, 2015

Related U.S. Application Data

(60) Provisional application No. 61/864,495, filed on Aug. 9, 2013.

(51) Int. Cl.
  *G11C 11/00*   (2006.01)
  *G11C 11/16*   (2006.01)

(52) U.S. Cl.
  CPC ................................. *G11C 11/1675* (2013.01)

(58) Field of Classification Search
  CPC .......................... G11C 11/161; G11C 11/1675
  USPC .................................................. 365/158, 173
  See application file for complete search history.

(56) References Cited

U.S. PATENT DOCUMENTS

| 8,018,787 | B2 | 9/2011 | Oh et al. |
| 8,077,508 | B1 | 12/2011 | Ong |
| 8,320,167 | B2 | 11/2012 | Rao et al. |
| 2011/0260224 | A1* | 10/2011 | Hidaka ........................ 257/295 |
| 2012/0051122 | A1* | 3/2012 | Tsuji et al. .................... 365/158 |
| 2012/0069638 | A1* | 3/2012 | Matsuda et al. .............. 365/158 |

OTHER PUBLICATIONS

Lee et al, "High-Performance Low-Energy STT MRAM Based on Balanced Write Scheme," ISLPED '12 Proceedings of the 2012 ACM/IEEE international symposium on Low power electronics and design, 2012, pp. 9-14.

* cited by examiner

*Primary Examiner* — Michael Tran
(74) *Attorney, Agent, or Firm* — Renaissance IP Law Group LLP

(57) ABSTRACT

An adaptive dual voltage memory write driver system can include an adaptive write voltage generator circuit to provide a first adjustable write voltage and to provide a second adjustable write voltage. The adaptive dual voltage memory write driver system can include an array of dummy memory cells coupled to the adaptive write voltage generator circuit and configured to provide resistive path tracking information to the adaptive write voltage generator circuit. The adjustable write voltages can be automatically increased or decreased responsive to the resistive path tracking information. A tri-state write driver circuit can provide a first adjustable write voltage source for writing "0"s and a second adjustable write voltage source for writing "1"s. A method for generating adjustable memory write voltages using dummy resistive path tracking may include receiving resistive path tracking information from a dummy section, and generating adjustable write voltages based on the resistive path tracking information.

24 Claims, 18 Drawing Sheets

ADAPTIVE DUAL VOLTAGE WRITE DRIVER WITH DUMMY RESISTIVE PATH TRACKING

CROSS-REFERENCES TO RELATED APPLICATIONS

This application claims the benefit of commonly assigned provisional application Ser. No. 61/864,495, filed Aug. 9, 2013, entitled "DUAL VOLTAGE WRITE SCHEME FOR STT-MRAM," the contents of which is incorporated herein by reference in its entirety.

BACKGROUND

The present inventive concepts relate to a dual voltage memory write technique, and more particularly to an adaptive dual voltage write driver with dummy resistive path tracking.

Moreover, the present inventive concepts relate to memory systems for storing information to memory integrated circuits, including static random access memory (SRAM), dynamic random access memory (DRAM), Flash memory, phase-change random access memory (PCRAM), spin-transfer torque random access memory (STT-RAM), magnetic random access memory (MRAM), resistive random access memory (RRAM), and future memory devices. Inventive aspects described herein are particularly well-suited for memories such as STT-RAM, MRAM and RRAM memories, which exhibit probabilistic-type characteristics and relatively high error rates.

Semiconductor memory devices have been widely used in electronic systems to store data. There are two general types of semiconductor memories: non-volatile and volatile memories. A volatile memory device, such as a Static Random Access Memory (SRAM) or a Dynamic Random Access Memory (DRAM), loses its data when the power applied to it is turned off. A non-volatile semiconductor memory device, however, such as a Flash, Erasable Programmable Read Only Memory (EPROM) or a magnetic random access memory (MRAM), retains its charge even after the power applied thereto is turned off. Where loss of data due to power failure or termination is unacceptable, a non-volatile memory is therefore used to store the data.

FIG. 1A shows a magnetic tunnel junction (MTJ) 10, which forms a variable resistor in an STT-MRAM type memory cell, and an associated select transistor 20, together forming an STT-MRAM cell 30. The MTJ 10 includes a reference or pinned layer 12, a free layer 16, and a tunneling layer 14 disposed between the reference layer 12 and the free layer 16. Transistor 20 is often an NMOS transistor due to its inherently higher current drive, lower threshold voltage, and smaller area relative to a PMOS transistor. The fixed current used to write a "1" in MRAM 30 can be different than the fixed current used to write a "0". The asymmetry in the direction of current flow during these two write conditions is caused by the asymmetry in the gate-to-source voltage of transistor 20.

In the following description, an MRAM cell is defined as being in a logic "0" state when the free and reference layers of its associated MTJ are in a parallel (P) state, i.e., the MTJ exhibits a low resistance. Conversely, an MRAM cell is defined as being in a logic "1" state when the free and reference layers of its associated MTJ are in an anti-parallel (AP) state, i.e., the MTJ exhibits a high resistance. It will be understood that in other embodiments, the MRAM cell can be defined as being in the logic "0" state when in an AP state, and the logic "1" state when in a P state. Furthermore, in the following, it is assumed that the reference layer of the MTJ 10 faces its associated select transistor, as shown in FIG. 1A.

Therefore, in accordance with the discussion above, a current flowing along the direction of arrow 35 (i.e., the up direction) either (i) causes a switch from the P state to the AP state thus to write a "1", or (ii) stabilizes the previously established AP state of the associated MTJ. Likewise, a current flowing along the direction of arrow 40 (i.e., the down direction) either (i) causes a switch from the AP state to the P state thus to write a "0", or (ii) stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 either (i) causes a switch from the AP state to the P, or (ii) stabilizes the previously established P state of the associated MTJ Likewise, in such embodiments, a current flowing along the direction of arrow 40 either (i) causes a switch from the P state to the AP state, or (ii) stabilizes the previously established AP state.

FIG. 1B is a schematic representation of MRAM 30 of FIG. 1A in which MTJ 10 is shown as a storage element whose resistance varies depending on the data stored therein. The MTJ 10 changes its state (i) from P to AP when the current flows along arrow 35, and/or (ii) from AP to P when the current flows along arrow 40.

The voltage required to switch the MTJ 10 from an AP state to a P state, or vice versa, must exceed the critical switching voltage, $V_{c0}$. The current corresponding to this voltage is referred to as the critical or switching current $I_{c0}$. While the specified critical value $V_{c0}$ and related critical switching current $I_{c0}$ can be defined in various ways, such values can be selected based on a 50% switching probability of the memory cell within a specified time. In other words, the critical switching current $I_{c0}$ can be selected or otherwise determined based on the design of the MTJ 10 and/or based on measurements of the probability of switching at a particular critical value $V_{c0}$ and/or switching current $I_{c0}$. When the threshold critical switching current $I_{c0}$ is satisfied, there can be a 50% chance that the stored memory bit switches values (e.g., from a "0" to a "1" or a "1" to a "0"). An overdrive current is applied to guarantee that switching occurs at an error rate that is acceptable to meet standard reliability expectations. This overdrive current, or switching current, $I_{sw}$, may be conventionally fixed at 1.3 times, 1.5 times, 2 times, or more than 2 times the value of $I_{c0}$. For example, if the $I_{c0}$ for an MTJ device is 7 microamps (uA) at a 20 nanosecond (ns) write pulse width, then the $I_{sw}$ used to reliably switch the states of the MTJ may be conventionally fixed at 11 uA or greater.

In some cases, the "safe" write current (e.g., where the write error rate is less than about 10e-9) may be conventionally fixed at 1.5 to 2 times the critical switching current $I_{c0}$ for a certain period of time, for example, 10 nanoseconds. To read the bit value back out of the memory cell, a relatively "safe" read current can be applied (e.g., where the read error rate is less than about 10e-9). For example, the "safe" read current may be 0.2 times (i.e., 20%) of the critical switching current $I_{c0}$. By way of another example, if the critical switching current $I_{c0}$ is 6 microamps (uA), then the write current under a normal operation mode can be conventionally fixed at 12 uA, or thereabout, and the read current under a normal operating mode can be less than 1.2 uA, or thereabout. In this manner, the probability of the memory cell properly switching under a normal write condition is very high, in some cases near 100%. Similarly, the probability of accidentally switching the value of the memory cell under a normal read condition can be very low, in some cases near zero.

Once in the AP state, removing the applied voltage does not affect the state of the MTJ 10. Likewise, to transition from the AP state to the P state under the normal operating mode, a negative voltage of at least $V_{c0}$ is applied so that a current level of at least the switching current $I_{c0}$ flows through the memory cell in the opposite direction. Once in the P state, removing the applied voltage does not affect the state of the MTJ 10.

In other words, MTJ 10 can be switched from an anti-parallel state (i.e., high resistance state, or logic "1" state) to a parallel state so as to store a "0" (i.e., low resistance state, or logic "0" state). Assuming that MTJ 10 is initially in a logic "1" or AP state, to store a "0", under the normal operating mode, a current at least as great or greater than the critical current $I_{c0}$ is caused to flow through transistor 20 in the direction of arrow 40. To achieve this, the source node (SL or source line) of transistor 20 is coupled to the ground potential via a resistive path (not shown), a positive voltage is applied to the gate node (WL or wordline) of transistor 20, and a positive voltage is applied to the drain node (BL or bitline) of transistor 20.

As mentioned above, MTJ 10 can also be switched from a parallel state to an anti-parallel state so as to store a "1". Assuming that MTJ 10 is initially in a logic "0" or P state, to store a "1", under the normal operating mode, a current at least as great or greater than the critical current $I_{c0}$ is caused to flow through transistor 20 in the direction of arrow 35. To achieve this, node SL is supplied with a positive voltage via a resistive path (not shown), node WL is supplied with a positive voltage, and node BL is coupled to the ground potential via a resistive path (not shown).

Unfortunately, conventional write techniques can result in over driving the MTJ, which may result in over voltage that lead to time dependent breakdown. In addition, with STT-RAM or any other type of memory chip, manufacturing processes and chip layout patterns may result in variations in the resistive qualities of memory components. In high density memories, a cell transistor is drawn to a minimum process features size. For example, $6F^2$ refers to a minimum process feature size (F) of 40 nanometers (nm), which yields a unit cell area of 0.0096 micrometers squared (i.e., $\mu m^2$). A cell transistor resistance (e.g., $R_{CTR}$ of FIG. 1B) can be very large, e.g., greater than 30 kilohms (kΩ). This dictates MTJ resistance (i.e., $R_{MTJ}$) to allow robust sensing margin during memory read out. For robust sensing margin with adequate signal to noise ratio, $R_{MTJ}$ should be greater than $R_{CTR}$, and tunnel magnetoresistance (TMR) should be greater than 300%. $R_{MTJ}$ is equal to either $R_P$ when in parallel (P) mode or R when in anti-parallel (AP) mode. Conventional approaches for memory writes use a single write voltage source having a fixed voltage level meeting a minimum write voltage requirement (i.e., $V_{MTJ\_RP}$) for $R_P$, which forces the $R_{AP}$ associated voltage (i.e., $V_{MTJ\_RAP}$) to come close to or even exceed the magnesium oxide (MgO) time dependent dielectric breakdown (TDDB) voltage. This may severely limit the write endurance and also impacts overall reliability.

The conventional memory write approaches are therefore inadequate. Inventive concepts disclosed herein address these and other limitations in the prior art.

BRIEF SUMMARY

According to features and principles of the present inventive concepts, an adaptive dual voltage memory write driver system can include an adaptive write voltage generator circuit including a first conductor that is configured to provide a first adjustable write voltage and a second conductor that is configured to provide a second adjustable write voltage, and an array of dummy memory cells coupled to the adaptive write voltage generator circuit and configured to provide resistive path tracking information to the adaptive write voltage generator circuit.

The adaptive write voltage generator circuit can adjust the first adjustable write voltage and the second adjustable write voltage responsive to the resistive path tracking information. The adaptive dual voltage memory write driver system can include a tri-state write driver circuit coupled to the adaptive write voltage generator circuit, and configured to receive the first adjustable write voltage from the first conductor of the adaptive write voltage generator circuit as a first adjustable write voltage source, and to receive the second adjustable write voltage from the second conductor of the adaptive write voltage generator circuit as a second adjustable write voltage source. The tri-state write driver circuit can include a first conductor to provide the first adjustable write voltage source for writing "0"s, and a second conductor to provide the second adjustable write voltage source for writing "1"s.

In some embodiments of the inventive concept, an adaptive dual voltage memory write driver system may include an adaptive write voltage generator circuit including an operational amplifier having an input conductor and an output conductor, wherein the output conductor is configured to provide a first adjustable write voltage for writing a "1" and to provide a second adjustable write voltage for writing a "0", first circuitry coupled to the input conductor of the operational amplifier and configured to provide resistive path tracking information to the adaptive write voltage generator circuit for writing the "1", and second circuitry coupled to the input conductor of the operational amplifier and configured to provide resistive path tracking information to the adaptive write voltage generator circuit for writing the "0". The adaptive write voltage generator circuit can adjust the first adjustable write voltage on the output conductor and the second adjustable write voltage on the same output conductor responsive to the resistive path tracking information.

In some embodiments of the inventive concept, a method for generating adjustable memory write voltages using dummy resistive path tracking, may include receiving, by an adaptive write voltage generator circuit, resistive path tracking information from a dummy section, generating a first adjustable write voltage on a first conductor based on the resistive path tracking information, and generating a second adjustable write voltage on a second conductor based on the resistive path tracking information.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1A:
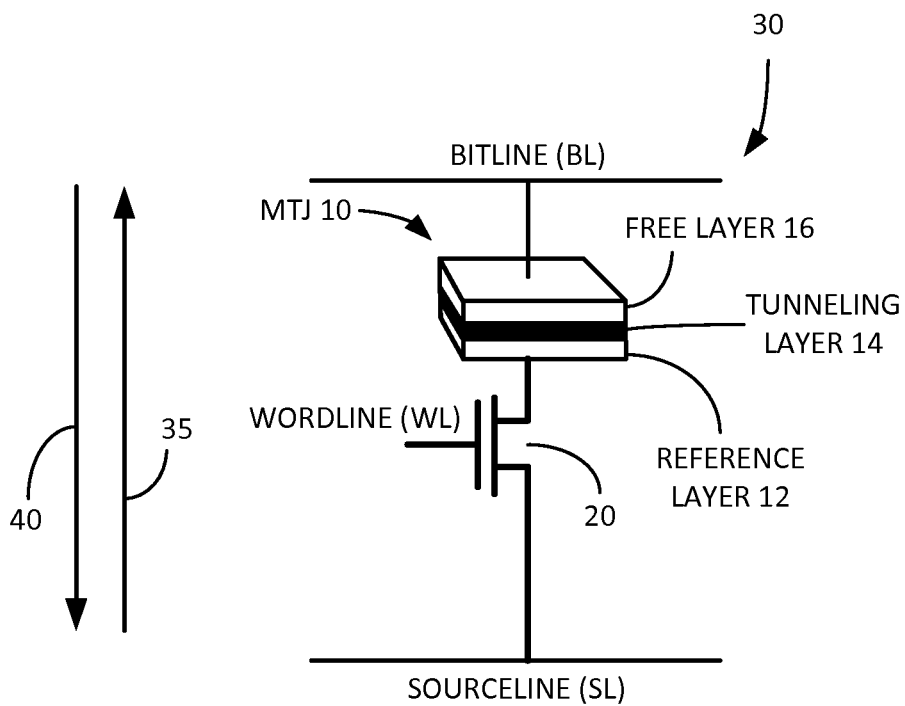
FIG. 1A is a schematic illustration showing layers of a magnetic tunnel junction structure coupled to an associated select transistor, as known in the related art.
Figure 1B:
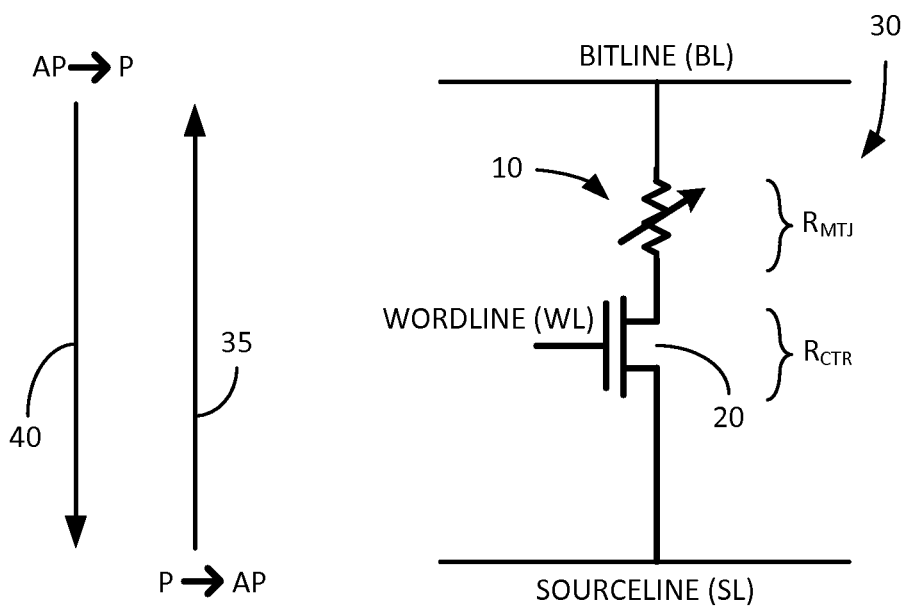
FIG. 1B is a schematic representation of the magnetic tunnel junction structure and its associated select transistor of FIG. 2, as known in the related art.
Figure 2:
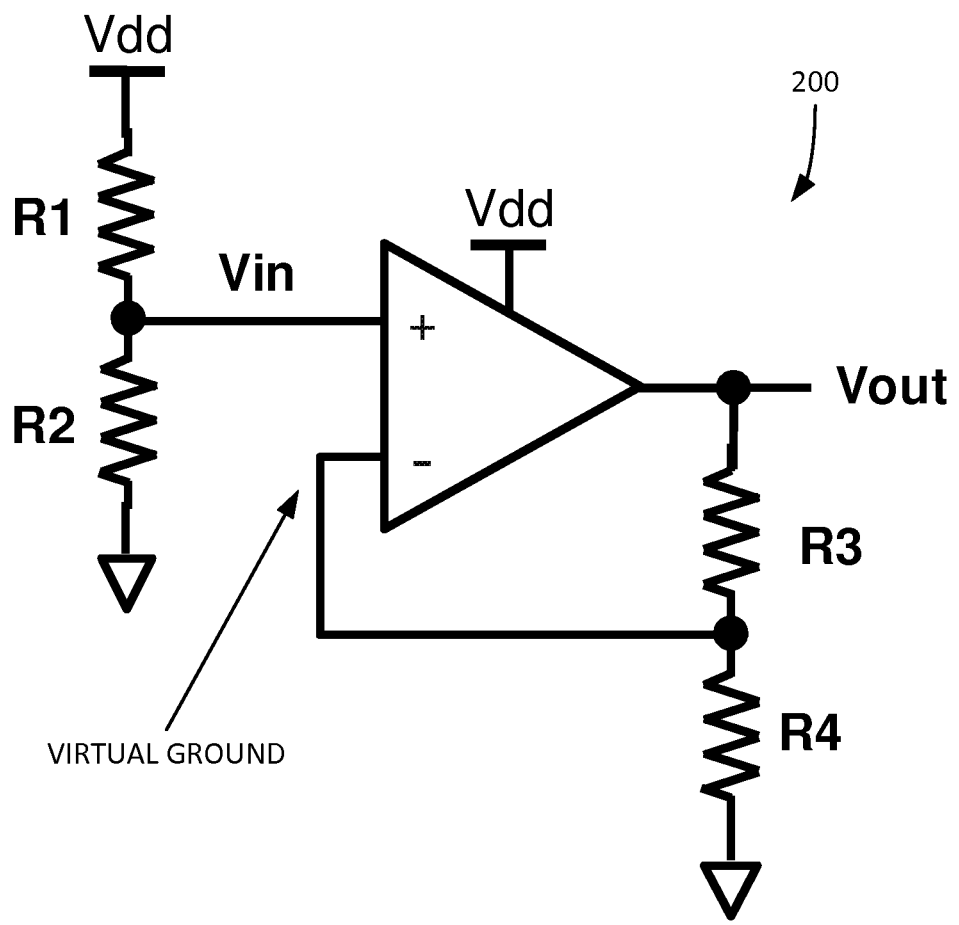
FIG. 2 is a schematic diagram showing an operation amplifier, as known in the related art.

FIG. 2 is a schematic diagram showing an operation amplifier 200, as known in the related art. As shown in FIG. 2, the operation amplifier 200 can include resistors R1, R2, R3, and R4. The non-inverting input of the operation amplifier receives Vin, which is characterized by the following equation (1):

$$Vin = \frac{R2}{R1 + R2} * Vdd. \tag{1}$$

The output Vout is characterized by the following equation (2):

$$Vout = \frac{R3 + R4}{R4} * Vin, \tag{2}$$

where Vout is less than or equal to Vdd.

Equation (2) can be rewritten as the following equation (3):

$$Vout = \left(1 + \frac{R3}{R4}\right)\left(\frac{R2}{R1 + R2}\right)Vdd, \tag{3}$$

where Vout is less than or equal to Vdd.

As shown in FIG. 2, the inverting input of the operational amplifier is coupled to the output Vout via resistor R3, and acts as a virtual ground. The resistor R1 is coupled to Vdd and to the resistor R2, which itself is coupled to ground. The resistor R3 is coupled to the output of the operational amplifier and to the resistor R4, which itself is coupled to ground.

Figure 3:
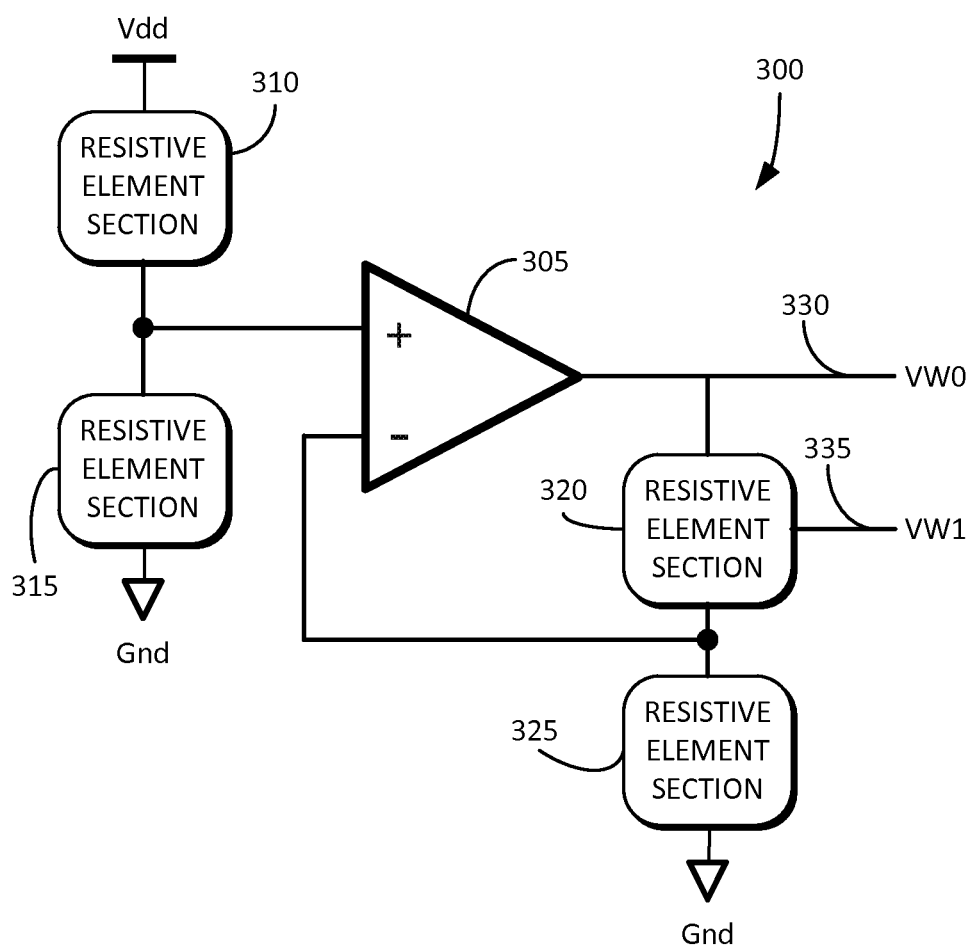
FIG. 3 is a schematic block diagram of an adaptive write voltage generator circuit, in accordance with an embodiment of the inventive concept.

FIG. 3 is a schematic block diagram of an adaptive write voltage generator circuit 300, in accordance with an embodiment of the inventive concept. As shown in FIG. 3, the adaptive write voltage generator circuit 300 can include an operation amplifier 300 and resistive element sections 310, 315, 320, and 325. One or more of the resistive element section can include one or more memory cells, including MTJ components, select transistors, resistors, or the like. One or more of the resistive element section can also include resistive lines such as memory bit lines (BLs) or memory source lines (SLs), or the like, as further explained below.

The adaptive write voltage generator circuit 300 includes two output conductors 330 and 335. The first output conductor 330 can provide a first adjustable write voltage (VW0). The second output conductor 335 can provide a second adjustable write voltage (VW1). The adaptive write voltage generator circuit 300 is a dual voltage generator having output adjustable write voltages that can be based on data-in information. The adaptive write voltage generator circuit 300 tracks memory processes, and delivers the right amount of voltage for writing. A dummy array of memory cells, as later illustrated and described, provide resistive path tracking information to the adaptive write voltage generator circuit 300, which causes the output write voltage levels VW0 and VW1 to be automatically adjusted, as also further described in detail below.

Figure 4:
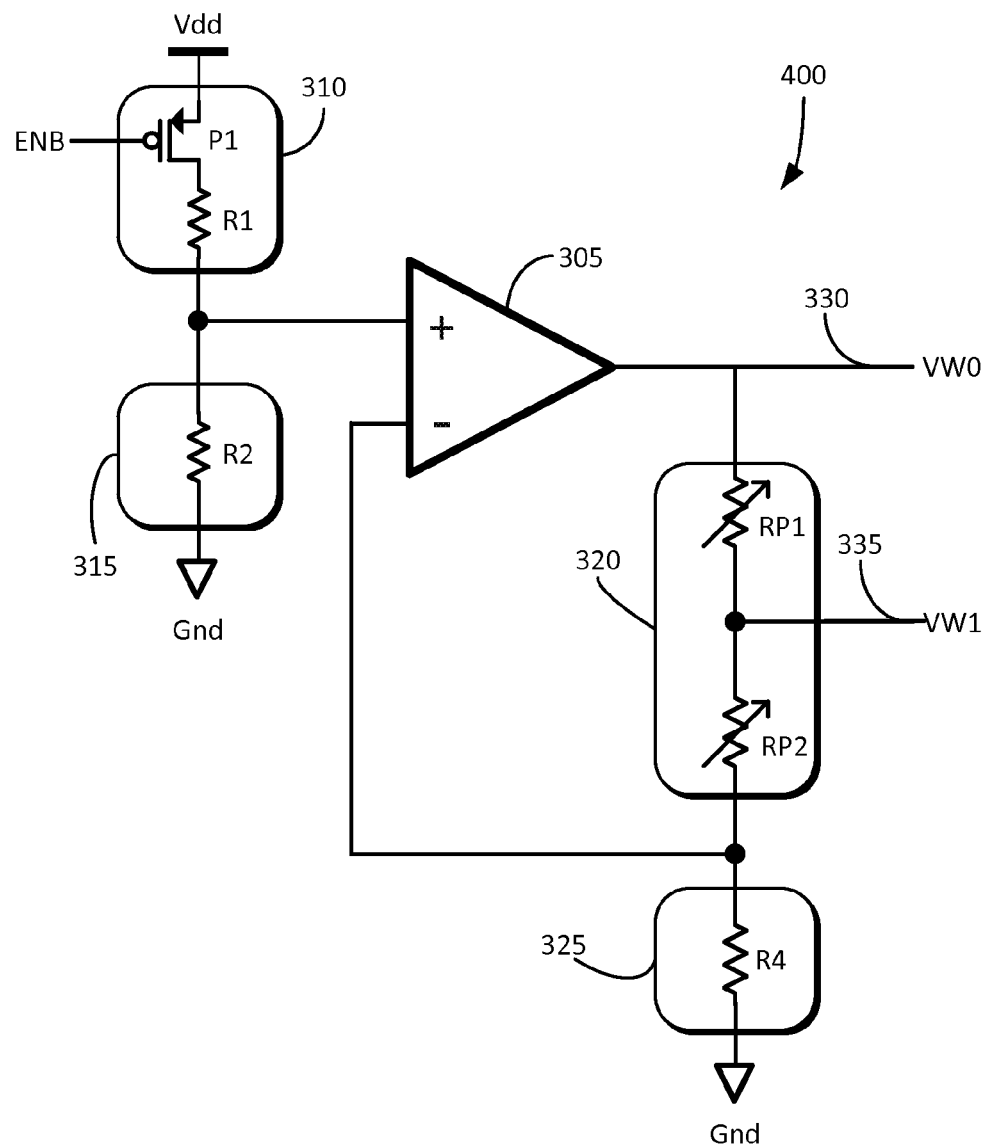
FIG. 4 is a schematic block diagram of an adaptive write voltage generator circuit, in accordance with another embodiment of the inventive concept.

FIG. 4 is a schematic block diagram of an adaptive write voltage generator circuit 400, in accordance with another embodiment of the inventive concept. As shown in FIG. 4, the adaptive write voltage generator circuit 400 can include the operation amplifier 305 and resistive element sections 310, 315, 320, and 325.

The resistive element section 310 can include a PMOS-type transistor P1 coupled to a voltage supply Vdd and to a resistor R1. The transistor P1 may be controlled by signal ENB. The resistive element section 315 can include a resistor R2. The resistive element section 320 can include two variable resistors RP1 and RP2 connected in series. Each of the variable resistors RP1 and RP2 can bet set to a resistance that is equivalent to an MTJ configured in a parallel state. Each of the variable resistors RP1 and RP2 can track the MTJ parallel state. The resistive element section 325 can include a resistor R4 coupled to ground.

The adaptive write voltage generator circuit 400 includes two output conductors 330 and 335. The first output conductor 330 is coupled to an output of the operational amplifier 305, and can provide the first adjustable write voltage (VW0). The second output conductor 335 is coupled to the resistive element section 320 between the first variable resistor RP1 and the second variable resistor RP2. The second output conductor 335 can provide the second adjustable write voltage (VW1).

Figure 5:
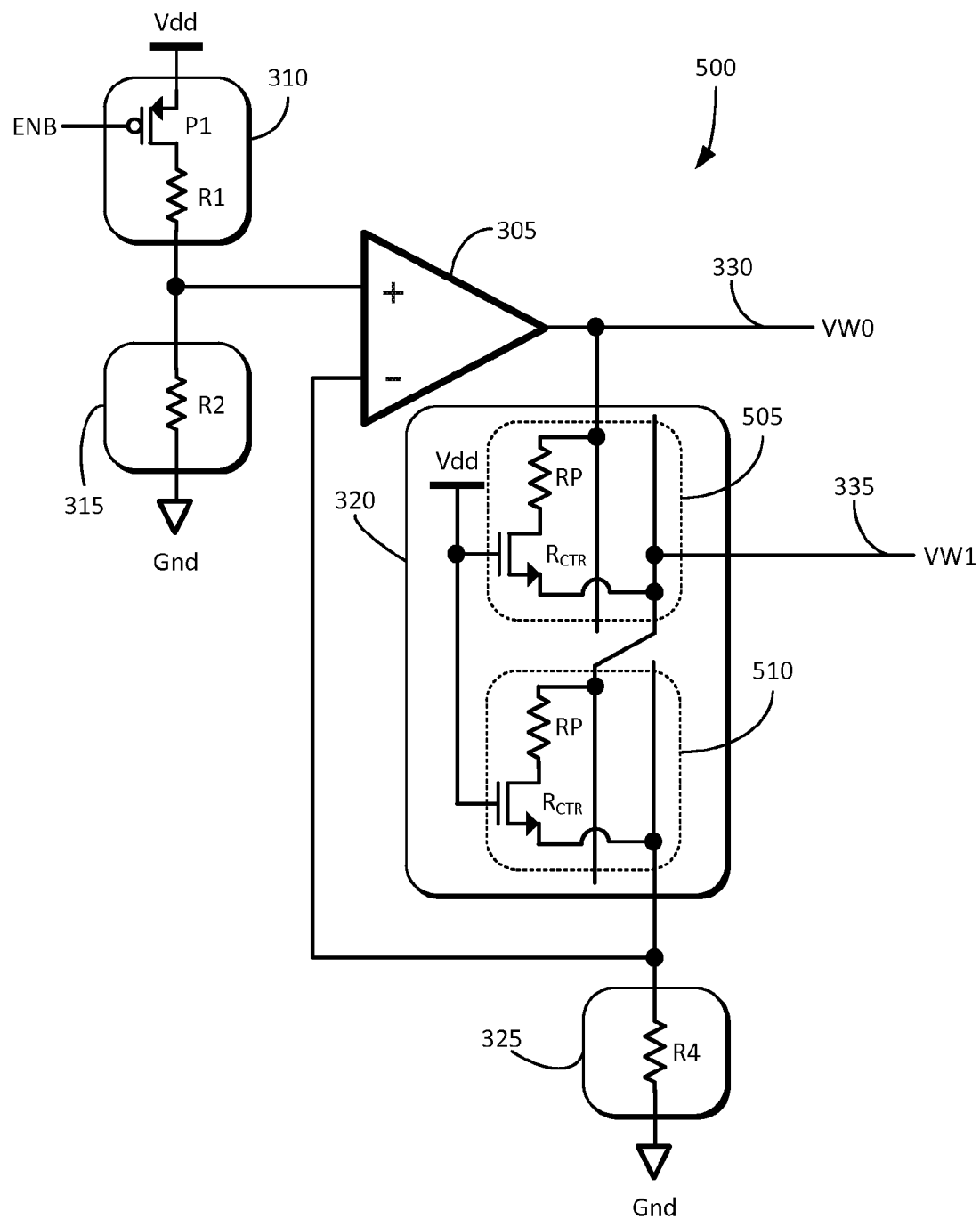
FIG. 5 is a schematic block diagram of an adaptive write voltage generator circuit, in accordance with yet another embodiment of the inventive concept.

FIG. 5 is a schematic block diagram of an adaptive write voltage generator circuit 500, in accordance with yet another embodiment of the inventive concept. Some of the elements and blocks illustrated in FIG. 4 are the same as or similar to those of FIG. 4, and therefore, a detailed description of such elements and blocks is not repeated. The primary difference is that the resistive element section 320 of the adaptive write voltage generator circuit 500 includes two resistive memory cells 505 and 510. Each of the resistive memory cells 505 and 510 can include a resistor RP, which may be an MTJ configured in the parallel state. Each of the resistive memory cells 505 and 510 can also include a select transistor having a resistance associated therewith indicated by $R_{CTR}$.

The first adjustable write voltage (VW0) is represented by or can be determined by the following equation (4):

$$VW0 = (1+2R_{CELL}/R4)*Vin, \quad (4):$$

where R1 is equal to R2, and $R_{CELL}$ is equal to $R_P + R_{CTR}$.

The second adjustable write voltage (VW1) is represented by or can be determined by the following equation (5):

$$VW1 = VW0*((R_{CELL}+R4)/(2R_{CELL}+R4)), \quad (5):$$

where R1 is equal to R2, and $R_{CELL}$ is equal to $R_P + R_{CTR}$.

Referring to FIG. 5, by way of example based on equation (4), assuming R1 is equal to R2, and Vdd is equal to 1.5 Volts (V), then Vin is equal to 0.75 V. In addition, assuming that $R_{CELL}$ is equal to $R_P + R_{CTR}$, which is equal to 60 kΩ, and that R4 is equal to 200 kΩ, then VW0 is equal to (1+120/200)*0.75=1.2 V. Under the same or similar assumptions, by way of another example based on equation (5), VW1 is equal to 1.2*((60+200)/(120+200))=0.975 V. It will be understood that these are representative values for the sake of providing an illustrative example, and other similar or different values can be used without departing from the inventive aspects.

Figure 6A:
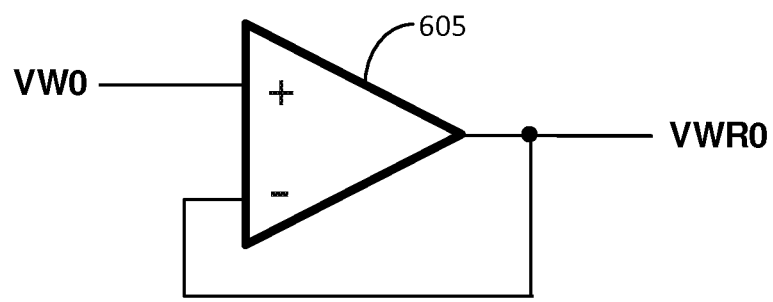
FIGS. 6A and 6B are schematic diagrams of unity gain repeaters, in accordance with an embodiment of the inventive concept.
Figure 6B:
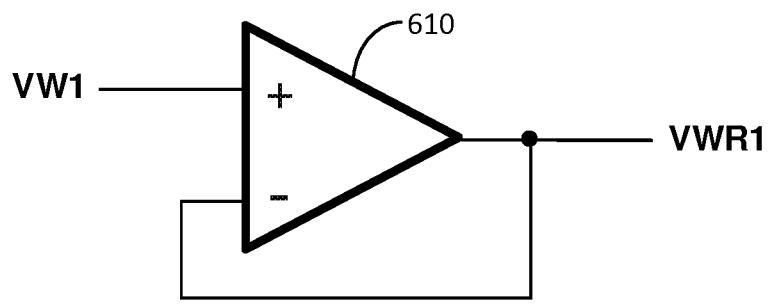

FIGS. 6A and 6B are schematic diagrams of unity gain repeaters 605 and 610, in accordance with an embodiment of the inventive concept. The unity gain repeater 605 can receive the first adjustable write voltage VW0 and transmit the VWR0 voltage. Similarly, the unity gain repeater 610 can receive the second adjustable write voltage VW1 and transmit the VWR1 voltage. The unit gain repeaters 605 and 610 may be associated with a memory bank or memory array, and may drive additional current and/or boost the VW0 and VW1 signals, respectively.

Figure 7:
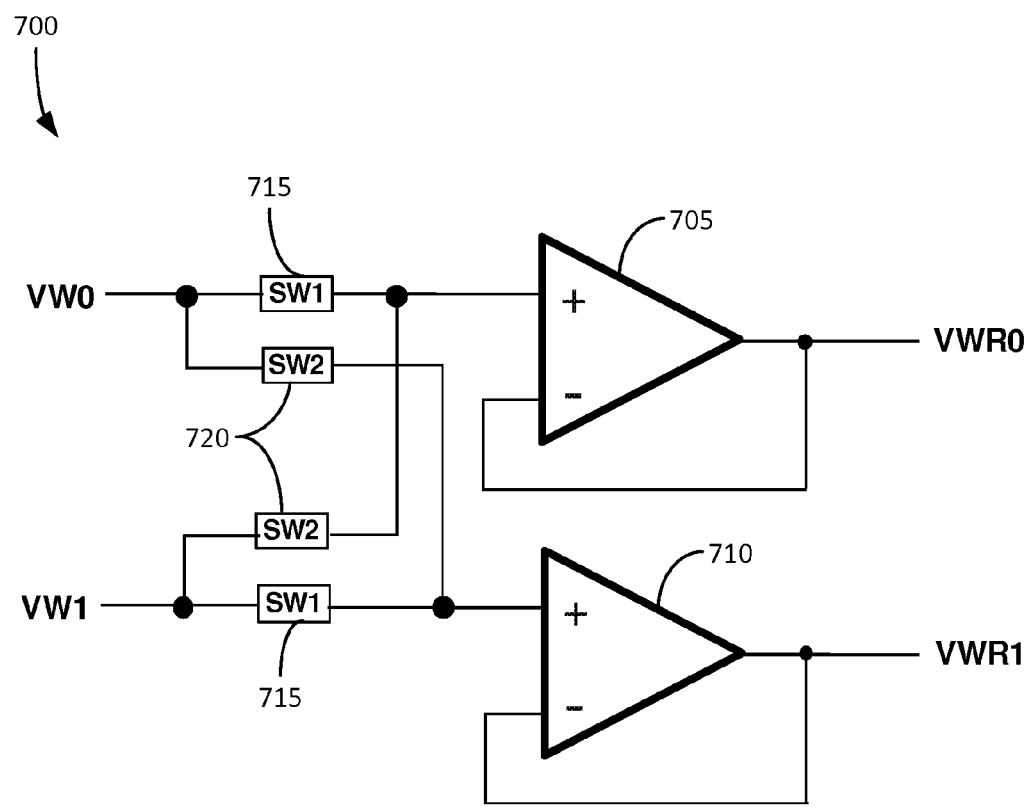
FIG. 7 is a schematic diagram of a switchable unity gain repeater, in accordance with yet another embodiment of the inventive concept.

FIG. 7 is a schematic diagram of a switchable unity gain repeater 700, in accordance with yet another embodiment of the inventive concept. The switchable unity gain repeater 700 can include a first operational amplifier 705 and a second operational amplifier 710. The switchable unity gain repeater 700 can receive the first adjustable write voltage VW0 and the second adjustable write voltage VW1, and transmit the VWR0 voltage and the VWR1 voltage, respectively. The switchable unit gain repeater 700 may be associated with a memory bank or memory array, and may drive additional current and/or boost the VW0 and VW1 signals, respectively.

Moreover, the switchable unity gain repeater 700 can include a switch 715 having associated switch elements SW1, and a switch 720 having associated switch elements SW2. The switches 715 and 720 may be controlled or otherwise programmed to switch the VWR0 and VWR1 voltage levels. The switches 715 and 720 may use registers, fuses, metal options, power transistors, e.g., large complementary metal-oxide semiconductor (CMOS) transistors, or the like.

In one embodiment, the switches 715 and 720 are configured such that VWR1 (i.e., the voltage level for writing an anti-parallel state ("1")) is less than VWR0 (i.e., the voltage level for writing a parallel state ("0")), where Vdd is greater to or equal to VWR0. The VWR1 and VWR0 voltage levels can be adjusted to meet $V_{sw}$ requirements for writing "1"s and "0"s. For example, the VWR1 and VWR0 voltage levels can be automatically increased and/or decreased based on the resistive path tracking data received.

In another embodiment, the switches 715 and 720 are configured such that VWR1 is greater than VWR0. For example, in cases where $I_{sw}$ is asymmetrical, depending on TMR, and/or depending on an excess transistor drive strength of the select transistor of a memory cell, a resistance to voltage curve may be skewed such that the MTJ voltage to write a "1" is less than the MTJ voltage to write a "0". The VWR1 and VWR0 voltage levels can be adjusted to meet $V_{sw}$ requirements for writing "1"s and "0"s. For example, the VWR1 and VWR0 voltage levels can be automatically increased and/or decreased based on the resistive path tracking data received.

Figure 8:
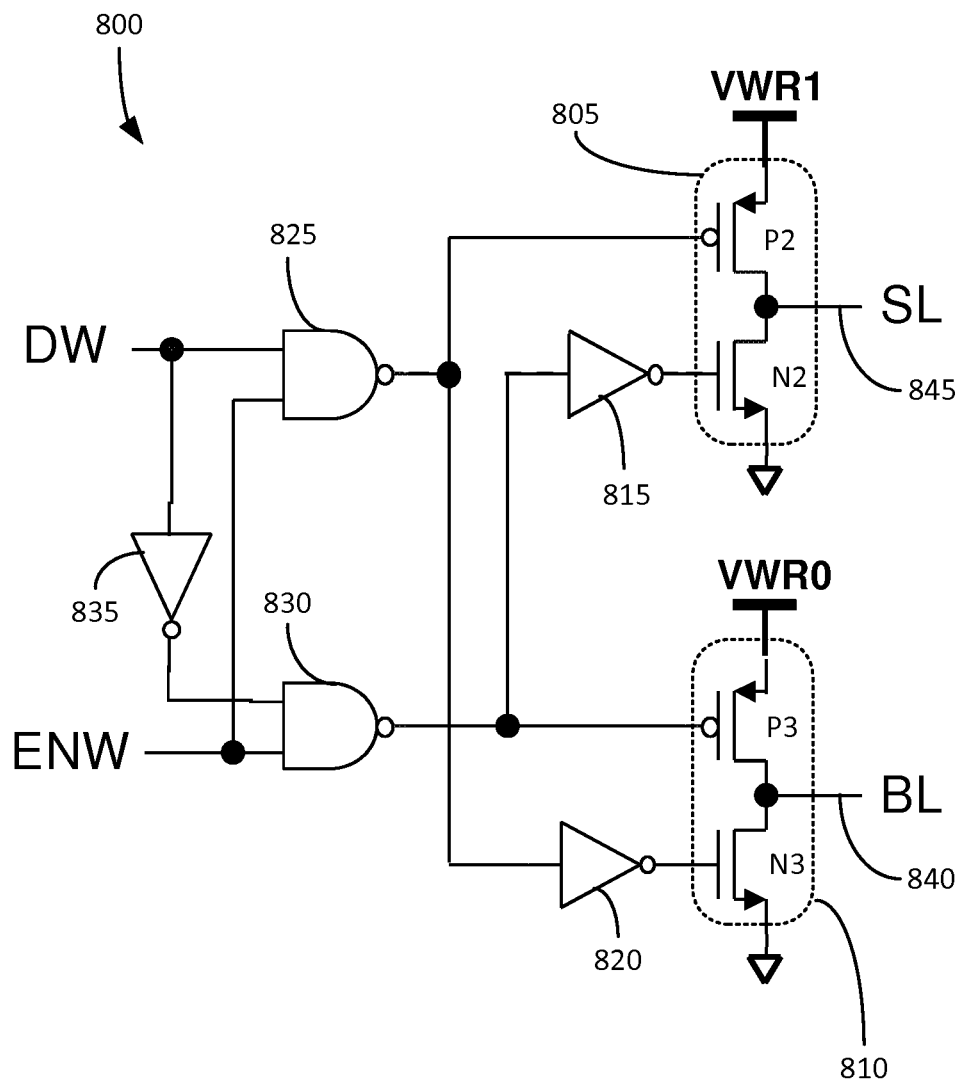
FIG. 8 is a schematic diagram of a tri-state write driver circuit, in accordance with another embodiment of the inventive concept.

FIG. 8 is a schematic diagram of a tri-state write driver circuit 800, in accordance with another embodiment of the inventive concept. The tri-state write driver circuit 800 can be coupled to the unite gain repeaters (e.g., of FIGS. 6A to 7) and to the adaptive write voltage generator circuit (e.g., of FIGS. 3 to 5). The tri-state write driver circuit 800 can receive the VWR1 and VWR0 adjustable write voltages. More specifically, a first output section 805 can receive the first adjustable write voltage VWR1 as a first adjustable write voltage source VWR1. Similarly, a second output section 810 can receive the second adjustable write voltage VWR0 as a second adjustable write voltage source VWR0.

The tri-state write driver 800 includes a first conductor 840 to provide a first adjustable write voltage source VWR0 for writing "0"s, and a second conductor 845 to provide a second adjustable write voltage source VWR1 for writing "1"s. One or more memory bit lines (BL) can be coupled to the first adjustable write voltage source VWR0 of the tri-state write driver 800 via the PMOS-type transistor P3. Similarly, one or more memory source lines (SL) can be coupled to the second adjustable write voltage source VWR1 of the tri-state write driver 800 via the PMOS-type transistor P2. NMOS-type transistors N2 and N3 of the output sections 805 and 810, respectively, can each be coupled to ground.

The tri-state write driver 800 can include a plurality of logic gates. For example, the tri-state write driver 800 can include NAND gates 825 and 830 and inverters 815, 820, and 835, as shown in FIG. 8. It will be understood that the circuit configuration shown in FIG. 8 is an illustrative example and other variations can be used without departing from the inventive aspects described herein. The tri-state write driver 800 can receive DW and ENW control signals for controlling the state of the output sections 805 and 810. For example, the DW and ENW control signals can determine whether the VWR1 source voltage or a ground voltage is passed to the conductor 845 and to the source line SL. By way of another example, the DW and ENW control signals can determine whether the VWR0 source voltage or the ground voltage is passed to the conductor 840 and to the bit line BL. By way of yet another example, the DW and ENW control signals can place one or more of the output sections 805 or 810 in a high-impedance state.

Figure 9:
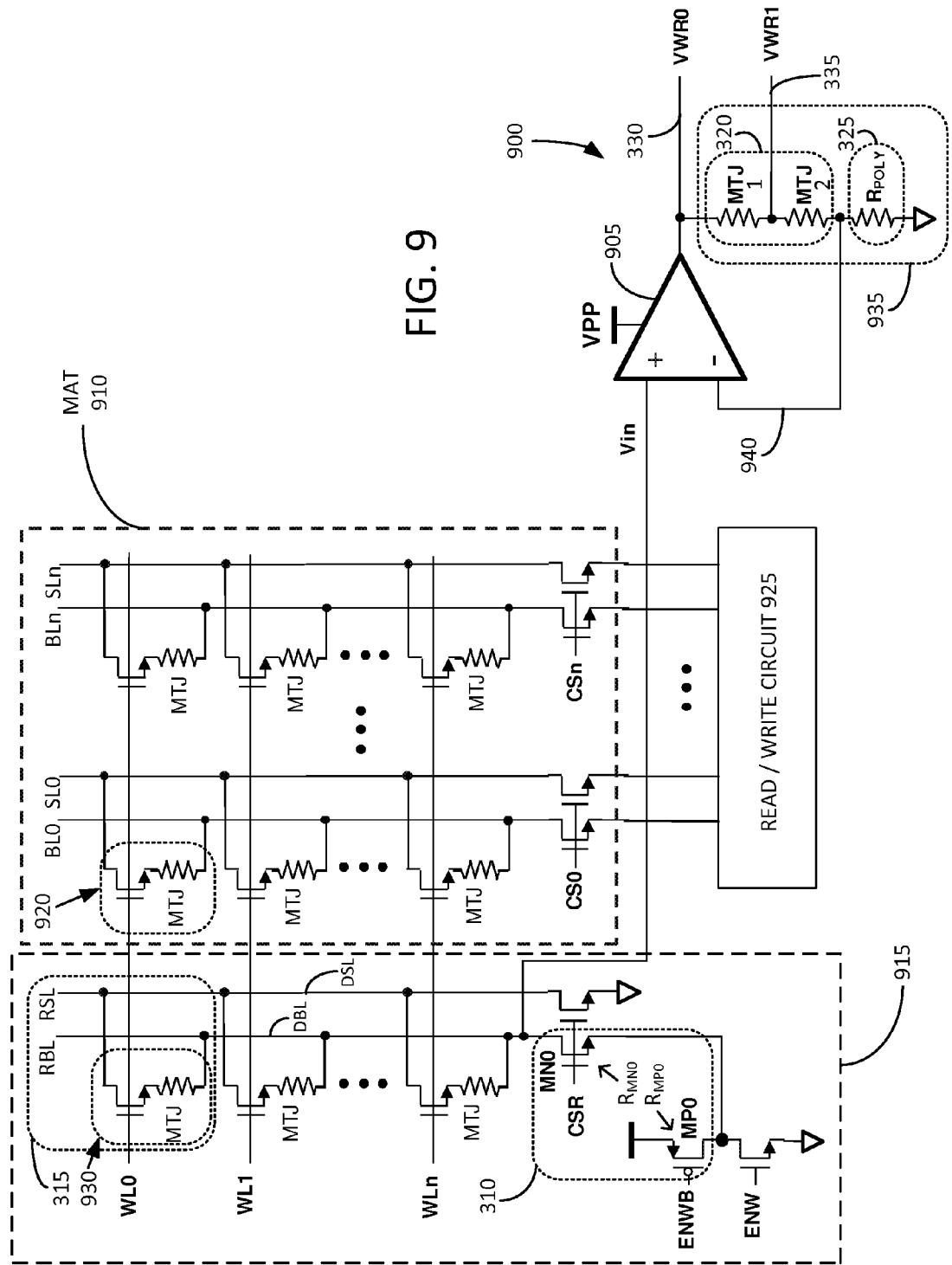
FIG. 9 is a schematic diagram of a memory array tile (MAT) and an adaptive dual voltage write driver with dummy resistive path tracking using a dummy section, in accordance with another embodiment of the inventive concept.

FIG. 9 is a schematic diagram of a memory array tile (MAT) 910 and an adaptive dual voltage write driver 900 with dummy resistive path tracking using dummy section 915, in accordance with another embodiment of the inventive concept. The MAT 910 can include multiple columns and/or rows of resistive type memory cells (e.g., 920), each of which may include an MTJ and a select transistor. Multiple bit lines and source lines can be associated with the memory cells of the MAT 910. For example, a bit line BL0 and a source line SL0 can be coupled to a first group of memory cells. A bit line BLn and a source line SLn may be coupled to another group of memory cells, and so on. The memory cells of the MAT 910 can be coupled to the read and/or write circuit 925 via transistors CS0 through CSn.

The dummy section 915 can be associated with the MAT 910. The dummy section 915 can include a dummy bit line DBL and a dummy source line DSL. The dummy bit line DBL and the dummy source line DSL can be coupled to an array of dummy memory cells (e.g., 930). The adaptive write voltage generator circuit 900 is coupled to at least one of the dummy bit line DBL or the dummy source line DSL. The adaptive write voltage generator circuit is configured to receive resistive path tracking information via the dummy bit line DBL and/or the dummy source line DSL. A first input Vin of the operation amplifier circuit 905 can be coupled to the dummy bit line DBL and/or the dummy source line DSL associated with the array of dummy memory cells of the dummy section 915.

The adaptive write voltage generator circuit 900 can include a multiplier section 935. The multiplier section 935 can include a plurality of resistive element sections 320 and 325. A first conductor 330 that provides the first adjustable write voltage VWR0 can be coupled to an output of the operation amplifier circuit 905. An end of a first resistive element (e.g., MTJ 1) of a first resistive element section 320 from among the plurality of resistive element sections (e.g., 320, 325, 315, and 310) can be coupled to the output of the operation amplifier 905. The second conductor 335 that is configured to provide the second adjustable write voltage VWR1 can be coupled to an opposite end of the first resistive element (e.g., MTJ 1) of the first resistive element section 320. An end of a second resistive element (e.g., MTJ 2) of the first resistive element section 320 can be coupled to the second conductor 335. The second input 940 to the operation amplifier circuit 905 can be coupled to an opposite end of the second resistive element (e.g., MTJ 2) of the first resistive element section 320. A second resistive element section 325 from among the plurality of resistive element sections can be coupled to ground and to the opposite end of the second resistive element (e.g., MTJ 2) of the first resistive element section 320.

The resistive element section 310 of the dummy section 915 can include a PMOS-type transistor MP0 having associated therewith a resistance $R_{MP0}$, and an NMOS-type transistor MN0 having associated therewith a resistance $R_{MN0}$. The resistance R1 associated with the resistive element section 310 can be equal to $R_{MP0}+R_{MN0}$.

The resistive element section 315 of the dummy section 915 can include a memory cell 930 having associated therewith a resistance $R_{CELL}$. The resistive element section 315 can also include the dummy bit line DBL having associated therewith a resistance $R_{BL}$, and the dummy source line DSL having associated therewith a resistance $R_{SL}$. The resistance R2 associated with the resistive element section 315 can be equal to $R_{BL}+R_{SL}+R_{CELL}$.

The input Vin of the operational amplifier 905 can be represented by or determined by the following equation (6):

$$Vin=(R2/(R1+R2))*Vdd, \qquad (6):$$

where Vin is proportional to R2.

The adjustable voltage levels VWR1 and VWR0 can track the bit line (BL) and/or source line (SL) resistances, and the resistance associated with a dummy memory cell that is similarly situated to a non-dummy memory cell, thereby providing accurate resistive path tracking information, which results in delivering safe and efficient write voltage levels. For example, if word line WL0 is selected, and data is to be written to the resistive memory cell 920, then the resistive path tracking information can include a resistance associated with the dummy memory cell 930, which is similarly disposed in the same row as the non-dummy memory cell 920, thereby providing accurate resistive path tracking information.

Due to process variations, line lengths, and the like, the resistances of memory cells, including the dummy memory cell, within a same row and associated with a same word line, are more alike than memory cells from two different rows. The resistive path tracking information can also include the dummy bit line DBL and the dummy source line DSL, which are similarly situated and have similar lengths to the non-dummy bit lines and source lines. In other words, the word line WLn is closer to the adaptive dual voltage write driver 900 and therefore the bit line resistance and the source line resistance are near zero. Conversely, the word line WL0 is more distant from the adaptive dual voltage write driver 900 and therefore the bit line resistance and the source line resistance will be greater. This is true for both the dummy section 915 and the associated MAT 910. Thus, the resistive path tracking information using the dummy section 915 is substantially the same as if it were an actual non-dummy memory cell, BL, SL, etc of the MAT 910. In this manner, a resistive path tracking feedback loop is fed into the adaptive dual voltage write driver 900 so that the write voltages VWR0 and VWR1 can be automatically and dynamically increased and/or decreased based on the selected word line.

The driver supply may be boosted to Vpp to increase and/or adjust the write voltage to be greater than Vdd. In addition, while the dummy source line DSL is shown as being tied to ground, it may be tied to ½ of Vdd as an alternative embodiment. Moreover, the inventive concepts described herein can be used with common source line architectures, pseudo common source line architectures, or the like.

Figure 10:
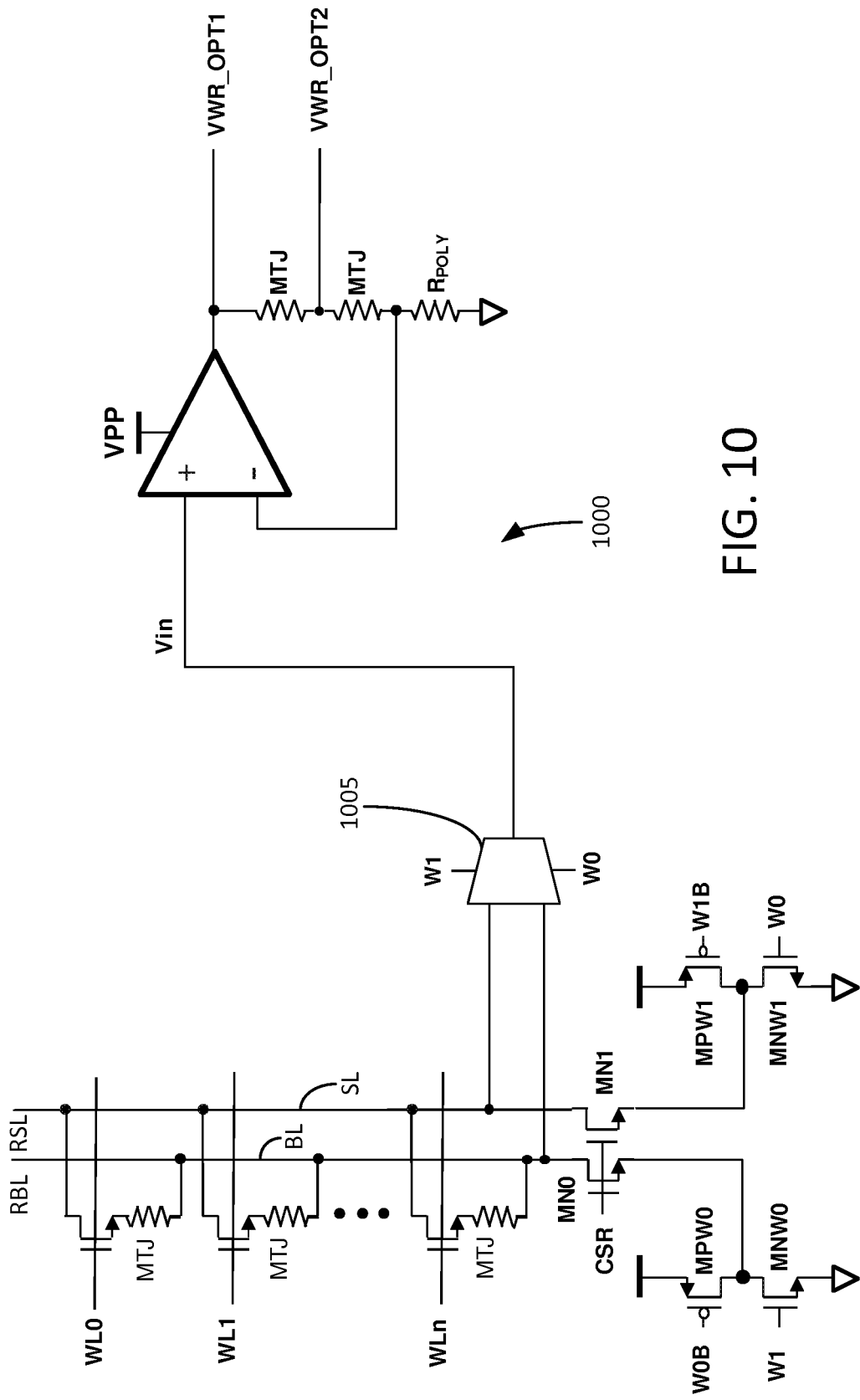
FIG. 10 is a schematic diagram of an adaptive dual voltage write driver including a switch for selecting between the bit line and the source line, in accordance with still another embodiment of the inventive concept.

FIG. 10 is a schematic diagram of an adaptive dual voltage write driver 1000 including a switch 1005 for selecting between the bit line (BL) and the source line (SL), in accordance with still another embodiment of the inventive concept. Some of the elements and blocks illustrated in FIG. 10 are the same as or similar to those of earlier figures, and therefore, a detailed description of such elements and blocks is not repeated. The switch 1005 can cause the voltage levels of VWR1 and VWR0 to be swapped. The switch 1005 can be programmatically or manually set. This provides a more dynamic operation. For example, the input signal Vin can be dynamically changed so that the adjustable write voltages VWR_OPT1 and/or VWR_OPT2 can be set to operate bi-directionally. In other words, when writing to memory cells, current can be caused to flow into the resistive memory cell from the bit line (BL) to a source line (SL). Or, depending on the configuration of the switch 1005, the current can be caused to flow into the resistive memory cell from the source line (SL) to the bit line (BL).

Figure 11:
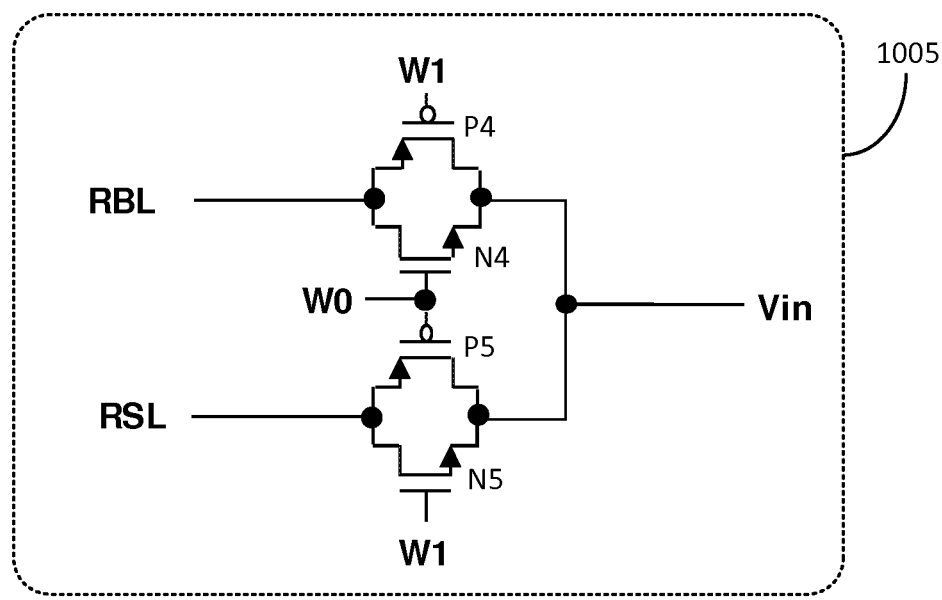
FIG. 11 is a schematic diagram of the switch of FIG. 10.

FIG. 11 is a schematic diagram of an example of the switch 1005 of FIG. 10. As can be seen in FIG. 11, the switch 1005 can include PMOS-type transistors P4 and P5. In addition, the switch 1005 can include NMOS-type transistors N4 and N5. The switch 1005 can receive resistance information $R_{BL}$ and $R_{SL}$ from the dummy bit line DBL and the dummy source line DSL, respectively. The switch 1005 can transmit the Vin signal. The switch 1005 can receive and be controlled by control signals W0 and W1.

Figures 12A, 12B:
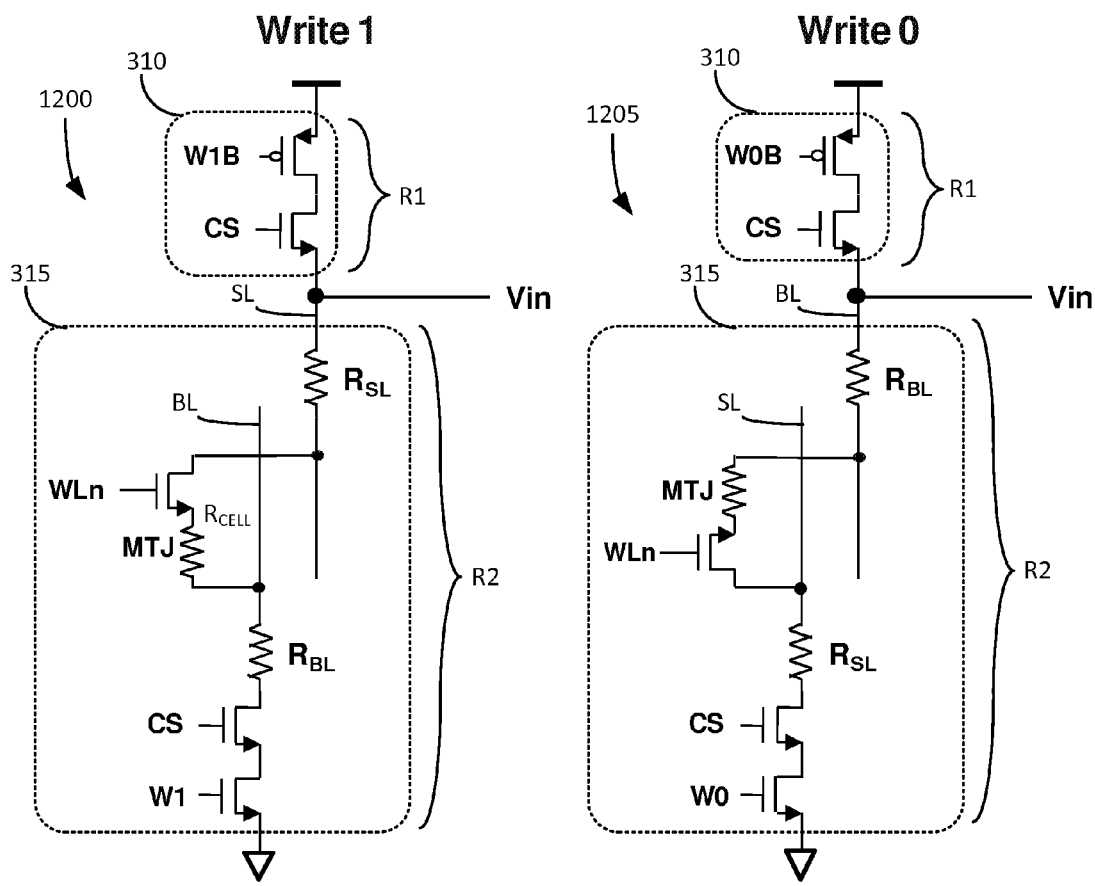
FIGS. 12A and 12B are schematic diagrams of circuitry used in a write "1" operation and a write "0" operation, respectively, in accordance with another embodiment of the inventive concept.
Figure 12C:
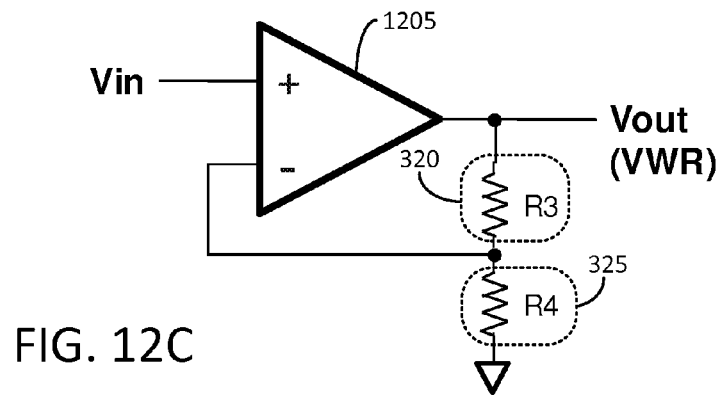
FIG. 12C is a schematic diagram of a single, adaptive, dual voltage generator circuit that is operable with the circuitry of FIGS. 12A and 12B.

FIGS. 12A and 12B are schematic diagrams of first circuitry 1200 to write a "1" and second circuitry 1205 to write a "0", respectively, in accordance with another embodiment of the inventive concept. FIG. 12C is a schematic diagram of a single, adaptive, dual voltage generator circuit that is operable with the circuitry of FIGS. 12A and 12B, and is structured for writing both "1"s and "0"s. Reference is now made to FIGS. 12A to 12C.

Referring to FIG. 12A, the resistive element section 310 of the first circuitry 1200 can include a write driver W1B PMOS-type transistor and a CS NMOS-type transistor having associated therewith a resistance R1. The resistance R1 associated with the resistive element section 310 can be equal to the sum of the resistance of the W1B PMOS-type transistor and the resistance of the CS NMOS-type transistor.

The resistive element section 315 of the first circuitry 1200 can include various circuit components having associated therewith various resistances, such as the resistance of the bit line $R_{BL}$, the resistance of the source line $R_{SL}$, the resistance of the memory cell $R_{CELL}$, the resistance of the CS NMOS-type transistor, and the resistance of the write driver W1 NMOS-type transistor. The resistance R2 associated with the resistive element section 315 can be equal to the sum of the resistances $R_{BL}$, $R_{SL}$, $R_{CELL}$, the resistance of the CS NMOS-type transistor, and the resistance of the write driver W1 NMOS-type transistor. Vin is coupled to the source line (SL) of the first circuitry 1200. The bit line (BL) of the first circuitry 1200 is coupled to ground.

Referring to FIG. 12B, the resistive memory cell of the second circuitry 1205 is flipped. The bit line (BL) of the second circuitry 1205 is coupled Vin and the source line (SL) is coupled to ground, which is essentially opposite to the resistive memory cell configuration of FIG. 12A. Otherwise, the circuit components themselves are similar to or the same as those of the first circuitry 1200, and the total resistances of the resistive element sections 310 and 315 can be calculated in a same or similar fashion as that described above with reference to FIG. 12A.

The Vin signal from each or both of the first circuitry 1200 and the second circuitry 1205 can be transmitted to the operational amplifier 1205. The operational amplifier 1205 can have an input conductor for receiving the Vin signal and an output conductor for transmitting a Vout signal. The output conductor can provide both a first adjustable write voltage VWR for writing a "1" and a second adjustable write voltage VWR for writing a "0", using the same output conductor. The resistive element sections 320 and 325 can include a resistance R3 and R4, respectively, as shown in FIG. 12C. The output Vout of the operational amplifier 1205 can be a single, dynamic, adjustable write voltage signal VWR, which can be used for writing two different configured types of resistive memory cells, as shown in FIGS. 12A and 12B.

The input Vin of the operational amplifier 1205 can be represented by or determined by the following equation (7):

$$Vin=(R2/(R1+R2))*Vdd, \qquad (7):$$

where Vin is proportional to R2.

The output Vout of the operational amplifier 1205 can be represented by or determined by the following equation (8):

$$Vout=(1+(R3/R4))*(R2/(R1+R2))*Vdd. \qquad (8):$$

The adaptive write voltage generator circuit of FIG. 12C can adjust the first adjustable write voltage VWR on the output conductor Vout for writing "1"s, and the second adjustable write voltage VWR on the output conductor Vout for writing "0"s, responsive to the resistive path tracking information received on the Vin conductor. The Vin input conductor of the operational amplifier 1205 can be coupled to a source line (SL) of the first circuitry 1200. The Vin input conductor of the operational amplifier 1205 can be coupled to a bit line (BL) of the second circuitry 1205.

Figure 12D:
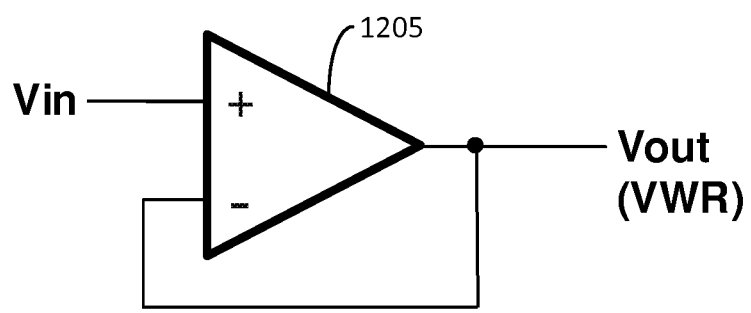
FIG. 12D is a schematic diagram of another embodiment of a single, adaptive, dual voltage generator circuit that is operable with the circuitry of FIGS. 12A and 12B.

FIG. 12D is a schematic diagram of another embodiment of a single, adaptive, dual voltage generator circuit 1205 that is operable with the circuitry of FIGS. 12A and 12B.

Figure 13:
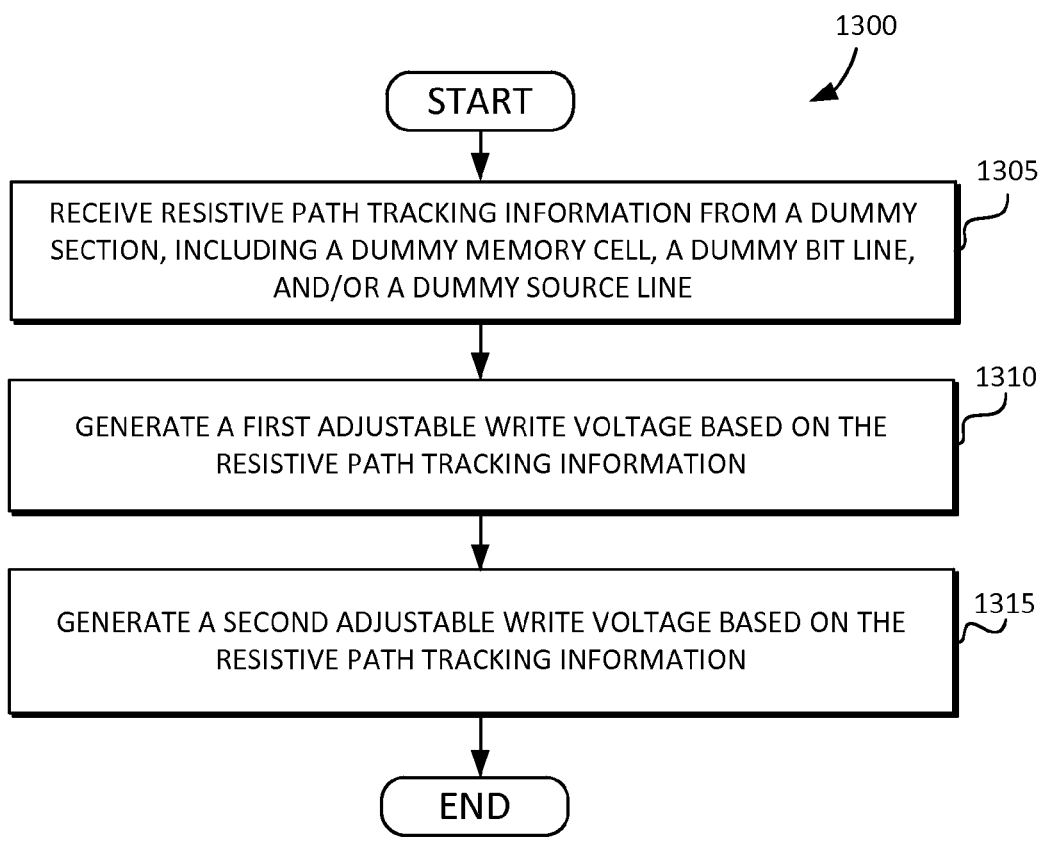
FIG. 13 is a flow chart illustrating a technique for generating adjustable memory write voltages using dummy resistive path tracking in accordance with inventive concepts.

FIG. 13 is a flow chart 1300 illustrating a technique for generating adjustable memory write voltages using dummy resistive path tracking in accordance with inventive concepts. The technique begins at 1305 where resistive path tracking information is received from a dummy section. The dummy section can include, for example, a dummy memory cell, a dummy bit line, and/or a dummy source line, as explained in detail above. The flow proceeds to 1310, where a first adjustable write voltage is generated based on the resistive path tracking information received from the dummy section. At 1315, a second adjustable write voltage is generated based on the resistive path tracking information received from the dummy section.

Thus, over driving the MTJ of the memory cells can be avoided. This, in turn, avoids the situation in which over voltage leads to time dependent breakdown. An overall increase in the write endurance and the reliability of memory write operations can therefore be achieved.

Figure 14:
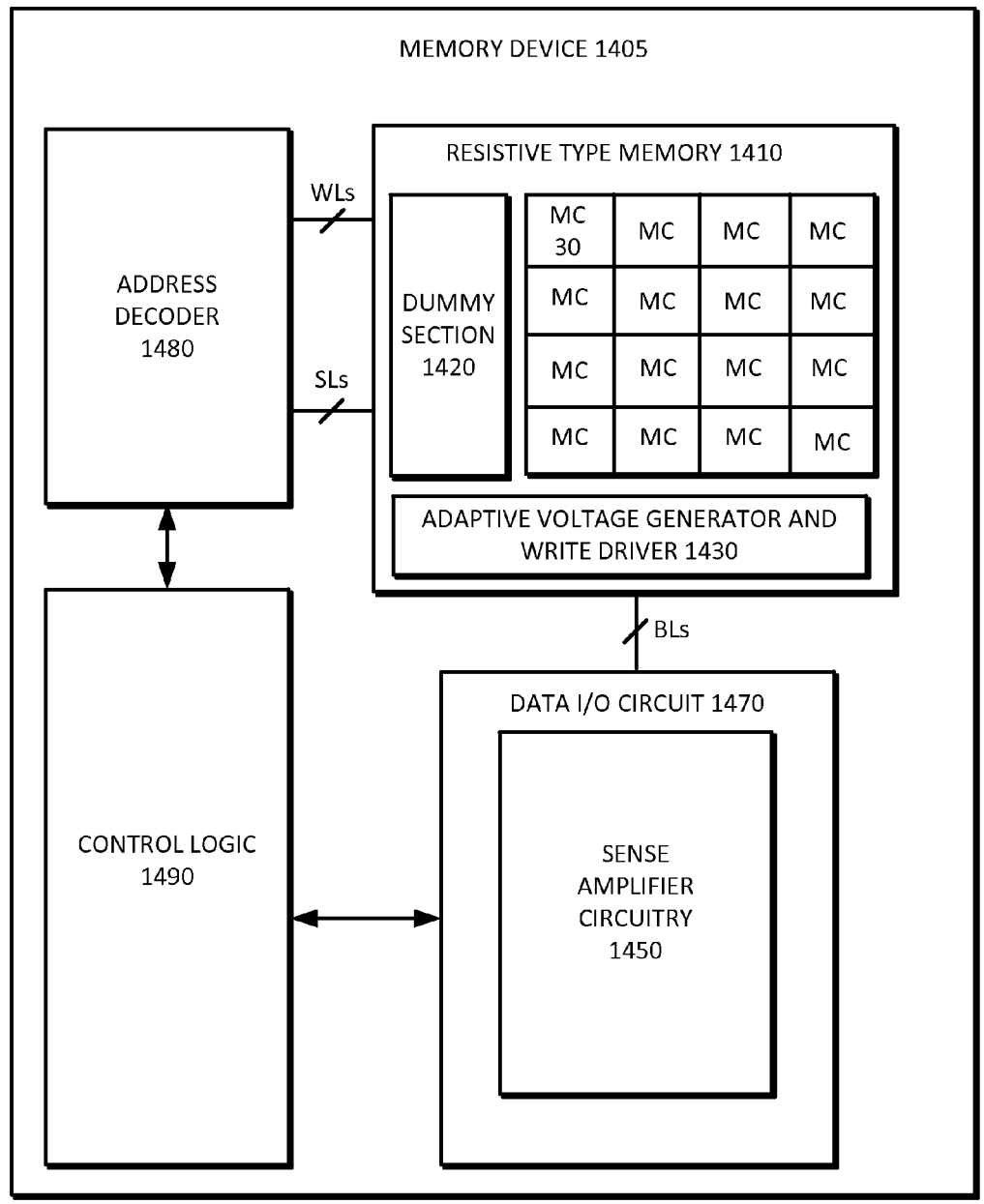
FIG. 14 is a block diagram of a memory device, including a resistive type memory, according to an embodiment of the inventive concept.

FIG. 14 is a block diagram of a memory device 1405, including a resistive type memory 1410, according to an embodiment of the inventive concept. Referring to FIG. 14, the memory device 1405 includes a memory cell array 1410, a data I/O circuit 1470, an address decoder 1480, and control logic 1490. The data I/O circuit 1470 may include the sense amplifier circuitry 1450 for sensing or reading bit information stored in memory cell array 1410.

Referring to FIG. 14, the resistive type memory 1410 may have a plurality of memory cells MC 30, each of which stores one or more data bits. The memory cells MC may be connected to a plurality of word lines WLs, a plurality of source lines SLs, and a plurality of bit lines BLs. The bit lines BLs may be arranged to intersect with the word lines WLs. The memory cells may be arranged at intersection portions (not shown) between the word lines and the bit lines. The resistive type memory 1410 can include one or more dummy sections 1420 as described in detail in above. The resistive type memory 1410 can also include an adaptive voltage generator and write driver circuitry 1430 as also described in detail above.

The address decoder 1480 may be connected to the resistive type memory 1410 via the word lines WLs and source lines SLs. The address decoder 1480 may operate responsive to the control of the control logic 1490. The address decoder 1480 may decode an input address to select the word lines WLs and source lines SLs. The address decoder 1480 may receive power (e.g., a voltage or a current) from the control logic 1490 to provide it to a selected or unselected word line.

The data input/output circuit 1470 may be connected to the memory cell array 1410 via the bit lines BLs. The data input/output circuit 1470 may operate responsive to the control of the control logic 1490. The data input/output circuit 1470 may select a bit line in response to a bit line selection signal (not shown) from the address decoder 1480. The data input/output circuit 1470 may receive power (e.g., a voltage or a current) from the control logic 1490 to provide it to a selected bit line.

The control logic 1490 may be configured to control an overall operation of the memory device 1405. The control logic 1490 may be supplied with external power and/or control signals. The control logic 1490 may generate power needed for an internal operation using the external power. The control logic 1490 may control read, write, and/or erase operations in response to the control signals.

The one or more dummy sections 1420 may be disposed in or coupled to other blocks, such as the Data I/O circuit 1470, the control logic 1490, and/or the address decoder 1480. In addition, the adaptive voltage generator and write driver 1430 may be disposed in or coupled to the other blocks.

Figure 15:
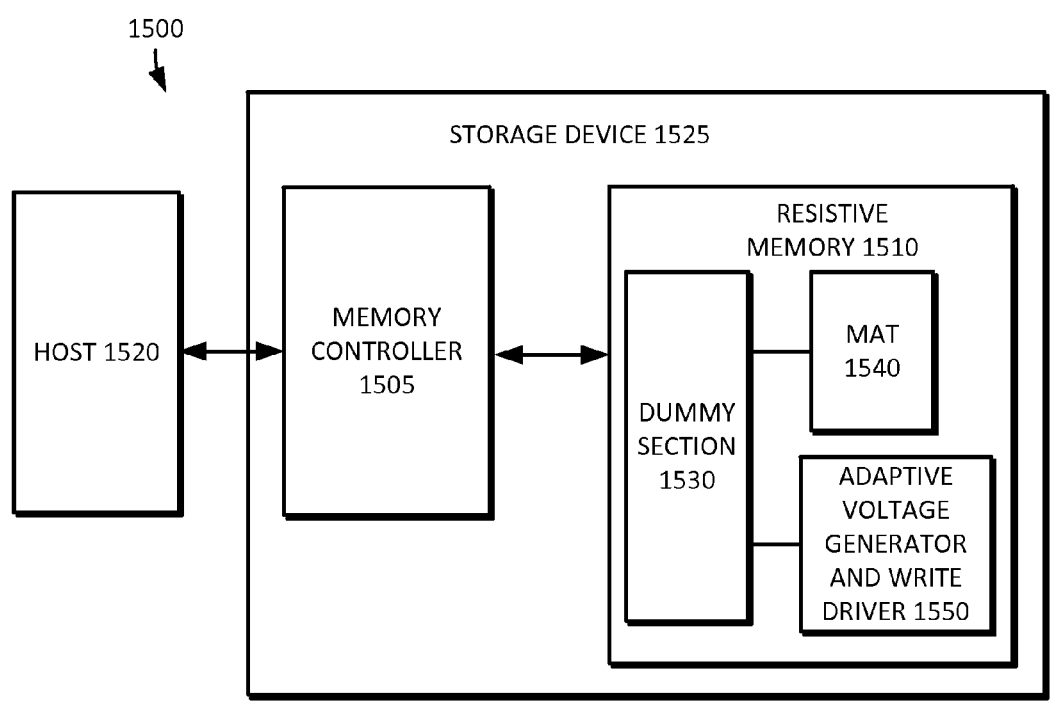
FIG. 15 is a block diagram schematically illustrating a computing system, including a host and a resistive type memory storage device, according to an embodiment of the inventive concept.

FIG. 15 is a block diagram 1500 schematically illustrating a computing system, including a host 1520 and a resistive type memory storage device 1525, according to an embodiment of the inventive concept. The storage device 1525 may include a resistive type memory 1510 and a memory controller 1505. The resistive type memory 1510 may include one or more dummy sections 1530, as described in detail above. The resistive type memory 1510 may include one or more MATs 1540, as described in detail above. The resistive type memory 1510 may include one or more adaptive voltage generators and/or write drivers 1550, as described in detail above.

The storage device 1525 may include a storage medium such as a memory card (e.g., SD, MMC, etc.) or an attachable handheld storage device (e.g., USB memory, etc.). The storage device 1525 may be connected to the host 1520. The storage device 1525 may transmit and receive data to and from the host 1520 via a host interface. The storage device 1525 may be powered by the host 1520 to execute an internal operation.

Figure 16:
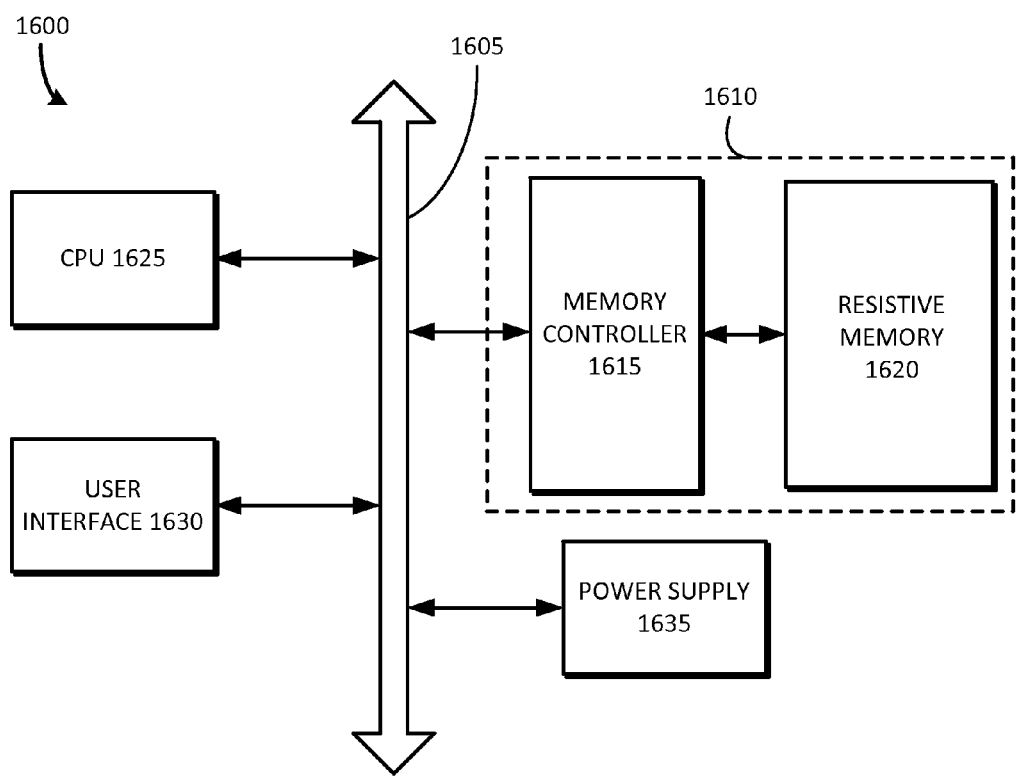
FIG. 16 is a block diagram schematically illustrating a computing system, including a memory controller and a resistive type memory, according to an embodiment of the inventive concept.

FIG. 16 is a block diagram schematically illustrating a computing system 1600, including a memory controller 1615 and a resistive type memory 1620, according to an embodiment of the inventive concept. Referring to FIG. 16, the computing system 1600 includes a memory system 1610, a power supply 1635, a central processing unit (CPU) 1625, and a user interface 1630. The memory system 1610 includes a resistive memory device 1620 and a memory controller 1615. The CPU 1625 is electrically connected to a system bus 1605.

The resistive memory device 1620 may include the one or more dummy sections, the one or more MATs, the one or more adaptive voltage generator circuits, and/or the one or more adaptive write drivers, as described in detail above, in accordance with an embodiment of the inventive concept. The resistive memory device 1620 may store data through the memory controller 1615. The data may be received from the user interface 1630 and/or processed by the CPU 1625. The memory system 1600 may be used as a semiconductor disc device (SSD).

Figure 17:
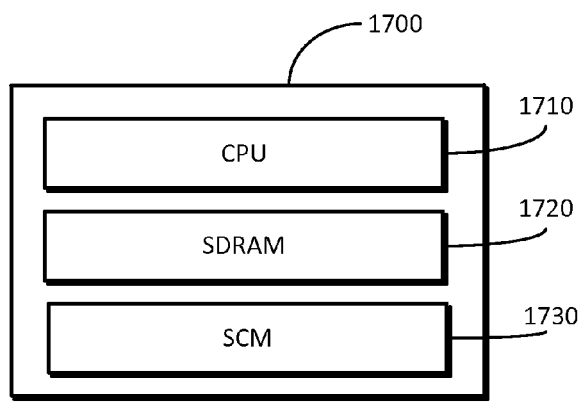
FIG. 17 is a block diagram schematically illustrating a memory system in which a flash memory is replaced with a storage class memory using a resistive memory, according to an embodiment of the inventive concept.

FIG. 17 is a block diagram schematically illustrating a memory system in which a flash memory is replaced with a storage class memory using a resistive memory, according to an embodiment of the inventive concept. Referring to FIG. 17, a memory system 1700 may include a CPU 1710, a synchronous DRAM (SDRAM) 1720, and a storage class memory (SCM) 1730. The SCM 1730 may be a resistive memory that is used as a data storage memory instead of a flash memory.

The SCM 1730 may access data in higher speed compared with a flash memory. For example, in a PC in which the CPU 1710 operates at a frequency of 4 GHz, a resistive memory being a type of SCM 1730 may provide an access speed higher than a flash memory. Thus, the memory system 1700 including the SCM 1730 may provide a relatively higher access speed than a memory system including a flash memory.

Figure 18:
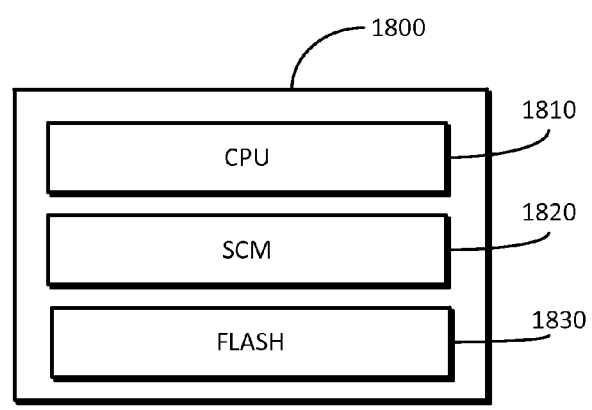
FIG. 18 is a block diagram schematically illustrating a memory system in which a synchronous DRAM is replaced with a storage class memory using a resistive memory, according to an embodiment of the inventive concept.

FIG. 18 is a block diagram schematically illustrating a memory system in which a synchronous DRAM is replaced with a storage class memory using a resistive memory, according to an embodiment of the inventive concept. Referring to FIG. 18, a memory system 1800 may include a CPU 1810, a storage class memory (SCM) 1820, and a flash memory 1830. The SCM 1820 may be used as a main memory instead of a synchronous DRAM (SDRAM).

Power consumed by the SCM 1820 may be less than that consumed by the SDRAM. A main memory may take about 40% of a power consumed by a computing system. For this reason, a technique of reducing power consumption of a main memory has been developed. Compared with the DRAM, the SCM 1820 may on average reduce 53% of dynamic energy consumption and about 73% of energy consumption due to power leak. Thus, the memory system 1800 including the SCM 1820 may reduce power consumption compared with a memory system including an SDRAM.

Figure 19:
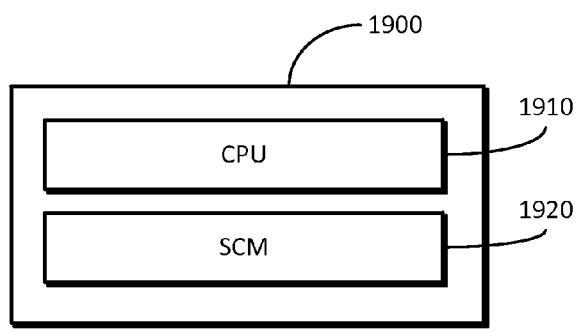
FIG. 19 is a block diagram schematically illustrating a memory system in which a synchronous DRAM and a flash memory are replaced with a storage class memory using a resistive memory according to an embodiment of the inventive concept.

FIG. 19 is a block diagram schematically illustrating a memory system in which a synchronous DRAM and a flash memory are replaced with a storage class memory using a resistive memory according to an embodiment of the inventive concept. Referring to FIG. 19, a memory system 1900 may include a CPU 1910 and a storage class memory (SCM) 1920. The SCM 1920 may be used as a main memory instead of a synchronous DRAM (SDRAM) and as a data storage memory instead of a flash memory. The memory system 1900 may be advantageous in the light of data access speed, low power, cost, and use of space.

A resistive memory device according to the inventive concept may be packed by at least one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

A resistive memory device according to an embodiment of the inventive concept may be applied to various products. The resistive memory device according to an embodiment of the inventive concept may be applied to storage devices such as a memory card, a USB memory, a solid state drive (SSD), and the like, as well as to electronic devices such as a personal computer, a digital camera, a camcorder, a cellular phone, an MP3 player, a PMP, a PSP, a PDA, and the like.

Although embodiments discussed herein generally make reference to emerging memory (STT-MRAM, RRAM), the main system memory can be any type of memory, including, for example, DRAM, SRAM, ROM, PROM, EEPROM, FLASH, FeRAM, PCRAM, RRAM, MRAM, STT-MRAM, RRAM or future memory types.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciated that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access. Embodiments of the inventive concept may include a non-transitory machine-readable medium comprising instructions executable by one or more processors, the instructions comprising instructions to perform the elements of the inventive concept as described herein.

The foregoing illustrative embodiments are not to be construed as limiting the invention thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. An adaptive dual voltage memory write driver system, comprising:
   an adaptive write voltage generator circuit including a first conductor that is configured to provide a first adjustable write voltage and a second conductor that is configured to provide a second adjustable write voltage;
   an array of dummy memory cells coupled to the adaptive write voltage generator circuit and configured to provide resistive path tracking information to the adaptive write voltage generator circuit; and
   a tri-state write driver circuit coupled to the adaptive write voltage generator circuit, and configured to receive the first adjustable write voltage from the first conductor of the adaptive write voltage generator circuit as a first adjustable write voltage source, and to receive the second adjustable write voltage from the second conductor of the adaptive write voltage generator circuit as a second adjustable write voltage source,
   wherein the tri-state write driver circuit includes a first conductor to provide the first adjustable write voltage source for writing "0"s, and a second conductor to provide the second adjustable write voltage source for writing "1"s.

2. The adaptive dual voltage memory write driver system of claim 1, wherein the adaptive write voltage generator circuit is configured to adjust the first adjustable write voltage and the second adjustable write voltage responsive to the resistive path tracking information.

3. The adaptive dual voltage memory write driver system of claim 1, wherein the resistive path tracking information includes magnetic tunnel junction (MTJ) resistance tracking information.

4. The adaptive dual voltage memory write driver system of claim 1, further comprising:
one or more memory bit lines coupled to the first adjustable write voltage source of the tri-state write driver; and
one or more memory source lines coupled to the second adjustable write voltage source of the tri-state write driver.

5. The adaptive dual voltage memory write driver system of claim 1, wherein in a first programmable first mode:
a level of the first adjustable write voltage source is greater than a level of the second adjustable write voltage source; and
a level of a logic voltage is greater than the level of the first adjustable write voltage source.

6. The adaptive dual voltage memory write driver system of claim 1, wherein in a second programmable mode:
a level of the second adjustable write voltage source is greater than a level of the first adjustable write voltage source; and
a level of a logic voltage is greater than the level of the second adjustable write voltage source.

7. The adaptive dual voltage memory write driver system of claim 1, further comprising:
a dummy bit line coupled to the array of dummy memory cells; and
a dummy source line coupled to the array of dummy memory cells,
wherein the adaptive write voltage generator circuit is coupled to at least one of the dummy bit line or the dummy source line, and is configured to receive the resistive path tracking information via the at least one of the dummy bit line or the dummy source line.

8. An adaptive dual voltage memory write driver system, comprising:
an adaptive write voltage generator circuit including a first conductor that is configured to provide a first adjustable write voltage and a second conductor that is configured to provide a second adjustable write voltage; and
an array of dummy memory cells coupled to the adaptive write voltage generator circuit and configured to provide resistive path tracking information to the adaptive write voltage generator circuit,
wherein the adaptive write voltage generator circuit further comprises:
an operation amplifier circuit including first and second inputs, wherein the first input is coupled to at least one of a dummy bit line or a dummy source line associated with the array of dummy memory cells; and
a multiplier section having a plurality of resistive element sections, wherein:
the first conductor that is configured to provide the first adjustable write voltage is coupled to an output of the operation amplifier circuit,
an end of a first resistive element of a first resistive element section from among the plurality of resistive element sections is coupled to the output of the operation amplifier,
the second conductor that is configured to provide the second adjustable write voltage is coupled to an opposite end of the first resistive element of the first resistive element section,
an end of a second resistive element of the first resistive element section is coupled to the second conductor, the second input to the operation amplifier circuit is coupled to an opposite end of the second resistive element of the first resistive element section, and
a second resistive element section from among the plurality of resistive element sections is coupled to ground and to the opposite end of the second resistive element of the first resistive element section.

9. The adaptive dual voltage memory write driver system of claim 8, further comprising:
a switch circuit coupled to the dummy bit line and the dummy source line, and configured to select between either the dummy bit line or the dummy source line,
wherein the switch circuit is coupled to the first input of the operation amplifier circuit.

10. The adaptive dual voltage memory write driver system of claim 1, further comprising:
one or more unity gain repeaters configured to drive the first adjustable write voltage.

11. The adaptive dual voltage memory write driver system of claim 1, further comprising:
one or more unity gain repeaters configured to drive the second adjustable write voltage.

12. An adaptive dual voltage memory write driver system, comprising:
an adaptive write voltage generator circuit including an operational amplifier having an input conductor and an output conductor, wherein the output conductor is configured to provide a first adjustable write voltage for writing a "1" and to provide a second adjustable write voltage for writing a "0";
first circuitry coupled to the input conductor of the operational amplifier and configured to provide resistive path tracking information to the adaptive write voltage generator circuit for writing the "1"; and
second circuitry coupled to the input conductor of the operational amplifier and configured to provide resistive path tracking information to the adaptive write voltage generator circuit for writing the "0".

13. The adaptive dual voltage memory write driver system of claim 12, wherein the adaptive write voltage generator circuit is configured to adjust the first adjustable write voltage on the output conductor and the second adjustable write voltage on the output conductor responsive to the resistive path tracking information.

14. The adaptive dual voltage memory write driver system of claim 12, wherein the input conductor of the operational amplifier is coupled to a source line of the first circuitry.

15. The adaptive dual voltage memory write driver system of claim 12, wherein the input conductor of the operational amplifier is coupled to a bit line of the second circuitry.

16. The adaptive dual voltage memory write driver system of claim 12, wherein the resistive path tracking information includes magnetic tunnel junction (MTJ) resistance tracking information.

17. A method for generating adjustable memory write voltages using dummy resistive path tracking, the method comprising:
receiving, by an adaptive write voltage generator circuit, resistive path tracking information from a dummy section;
generating a first adjustable write voltage on a first conductor based on the resistive path tracking information;
generating a second adjustable write voltage on a second conductor based on the resistive path tracking information;
providing, by a tri-state write driver, a first adjustable write voltage source for writing "0"s; and providing, by the tri-state write driver, a second adjustable write voltage source for writing "1"s.

18. The method of claim 17, further comprising:
adjusting at least one of the first adjustable write voltage or the second adjustable write voltage responsive to the resistive path tracking information.

19. The method of claim 18, wherein adjusting further comprises automatically increasing at least one of the first adjustable write voltage or the second adjustable write voltage responsive to the resistive path tracking information.

20. The method of claim 18, wherein adjusting further comprises automatically decreasing at least one of the first adjustable write voltage or the second adjustable write voltage responsive to the resistive path tracking information.

21. The method of claim 17, wherein receiving the resistive path tracking information from the dummy section further comprises:
receiving, from at least one of a dummy bit line or a dummy source line, the resistive path tracking information.

22. The method of claim 21, wherein the resistive path tracking information includes magnetic tunnel junction (MTJ) resistance tracking information.

23. A method for generating adjustable memory write voltages using dummy resistive path tracking, the method comprising:
receiving, by an adaptive write voltage generator circuit, resistive path tracking information from a dummy section;
generating a first adjustable write voltage on a first conductor based on the resistive path tracking information; and
generating a second adjustable write voltage on a second conductor based on the resistive path tracking information,
wherein receiving the resistive path tracking information from the dummy section further comprises:
receiving, from at least one of a dummy bit line or a dummy source line, the resistive path tracking information;
the method further comprising:
selecting, by a switch, between either the dummy bit line or the dummy source line; and
receiving, by the adaptive write voltage generator circuit, the resistive path tracking information via the selected dummy bit line or the selected dummy source line.

24. The method of claim 17, further comprising:
boosting, by one or more unity gain repeaters, the first adjustable write voltage and the second adjustable write voltage.

* * * * *